United States Patent
Zhou et al.

(10) Patent No.: US 8,902,580 B2
(45) Date of Patent: Dec. 2, 2014

(54) HEAT DISSIPATION DEVICE WITH FASTENER

(75) Inventors: Jin-Huai Zhou, KunShan (CN); Wei-Hsiang Chang, New Taipei (TW); Zhen Tang, KunShan (CN)

(73) Assignees: Furui Precise Component (Kunshan) Co., Ltd., Kunshan (CN); Foxconn Technology Co., Ltd., New Taipei (TW)

( * ) Notice: Subject to any disclaimer, the term of this patent is extended or adjusted under 35 U.S.C. 154(b) by 0 days.

(21) Appl. No.: 13/592,356

(22) Filed: Aug. 23, 2012

(65) Prior Publication Data

US 2013/0340973 A1 Dec. 26, 2013

(30) Foreign Application Priority Data

Jun. 25, 2012 (CN) .......................... 2012 1 0210018

(51) Int. Cl.
*G06F 1/20* (2006.01)
*H05K 5/00* (2006.01)
*H05K 7/20* (2006.01)

(52) U.S. Cl.
USPC ............... 361/679.47; 411/999; 165/80.3; 248/346.03

(58) Field of Classification Search
USPC ............... 248/346.03, 346.01; 361/679.47, 361/679.54, 710, 695, 701, 702, 704, 703, 361/709; 411/999, 107, 353
See application file for complete search history.

(56) References Cited

U.S. PATENT DOCUMENTS

| | | | | |
|---|---|---|---|---|
| 2,571,747 A | * | 10/1951 | Murphy | 411/107 |
| 3,437,119 A | * | 4/1969 | Dey | 411/349 |
| 3,561,075 A | * | 2/1971 | Selinko | 24/704.1 |
| 3,700,020 A | * | 10/1972 | Wallace | 411/512 |
| 5,603,594 A | * | 2/1997 | Lincoln | 411/84 |
| 5,662,163 A | * | 9/1997 | Mira | 165/80.3 |
| 6,643,137 B1 | * | 11/2003 | Chung et al. | 361/719 |
| 6,646,881 B1 | * | 11/2003 | Lai et al. | 361/719 |
| 6,679,712 B2 | * | 1/2004 | Chang | 439/248 |
| 6,796,760 B1 | * | 9/2004 | Tanner | 411/107 |
| 6,930,884 B2 | * | 8/2005 | Cromwell et al. | 361/710 |
| 7,190,586 B2 | * | 3/2007 | Franz et al. | 361/704 |
| 7,207,762 B2 | * | 4/2007 | Teal | 411/526 |
| 7,277,287 B2 | * | 10/2007 | Chen et al. | 361/700 |
| 7,609,522 B2 | * | 10/2009 | Jin et al. | 361/710 |
| 7,708,510 B2 | * | 5/2010 | Reimler | 411/166 |
| 7,764,503 B2 | * | 7/2010 | Zha | 361/704 |
| 7,929,309 B2 | * | 4/2011 | Zhao et al. | 361/719 |
| 8,122,945 B2 | * | 2/2012 | Kuo et al. | 165/80.3 |
| 2005/0195572 A1 | * | 9/2005 | Franz et al. | 361/707 |
| 2007/0025086 A1 | * | 2/2007 | Huang et al. | 361/704 |
| 2007/0058343 A1 | * | 3/2007 | Deng et al. | 361/695 |
| 2008/0130233 A1 | * | 6/2008 | Jin et al. | 361/704 |

* cited by examiner

*Primary Examiner* — Nkeisha Smith
(74) *Attorney, Agent, or Firm* — Novak Druce Connolly Bove + Quigg LLP

(57) ABSTRACT

A heat dissipation device includes a base and a fastener. The fastener includes a neck portion, a head portion formed at one end of the neck portion, and an engaging portion formed at another opposite end of the neck portion. The base defines a receiving portion through the base. The receiving portion includes an inserting hole and a mounting hole communicating with the inserting hole. The engaging portion extends through the inserting hole from a top of the base to make the neck portion enter the inserting hole. The neck portion is then crushed into the mounting hole from the inserting hole. The engaging portion abuts the bottom side of the base at a periphery of the mounting hole. The head portion abuts the top side of the base at the periphery of the mounting hole.

3 Claims, 5 Drawing Sheets

HEAT DISSIPATION DEVICE WITH FASTENER

CROSS-REFERENCE TO RELATED APPLICATION

This application is related to a co-pending application entitled "HEAT DISSIPATION DEVICE WITH FASTENER AND FLANGE" Ser. No. 13/592,354, assigned to the same assignee of this application and filed on the same date. The disclosure of the co-pending application is wholly incorporated herein by reference.

BACKGROUND

1. Technical Field

The disclosure relates to heat dissipation devices and, more particularly, to a heat dissipation device with a fastener for fastening the heat dissipation device on a printed circuit board.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air.

In order to keep the heat sink in intimate contact with the electronic device, a fastener extends through the heat sink and a printed circuit board where the electronic device is located to fasten the heat sink to the electronic device. However, before the heat sink mounted on the electronic device, the fastener is usually pre-assembled on the heat sink by an annular collar which snaps with an end of the fastener extending beyond the heat sink, for facilitating transportation. However, the collar is prone to disengage from the fastener when subjected to an outer force during transportation, resulting in falling of the fastener from the heat sink.

What is needed, therefore, is a heat dissipation device with a fastener which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
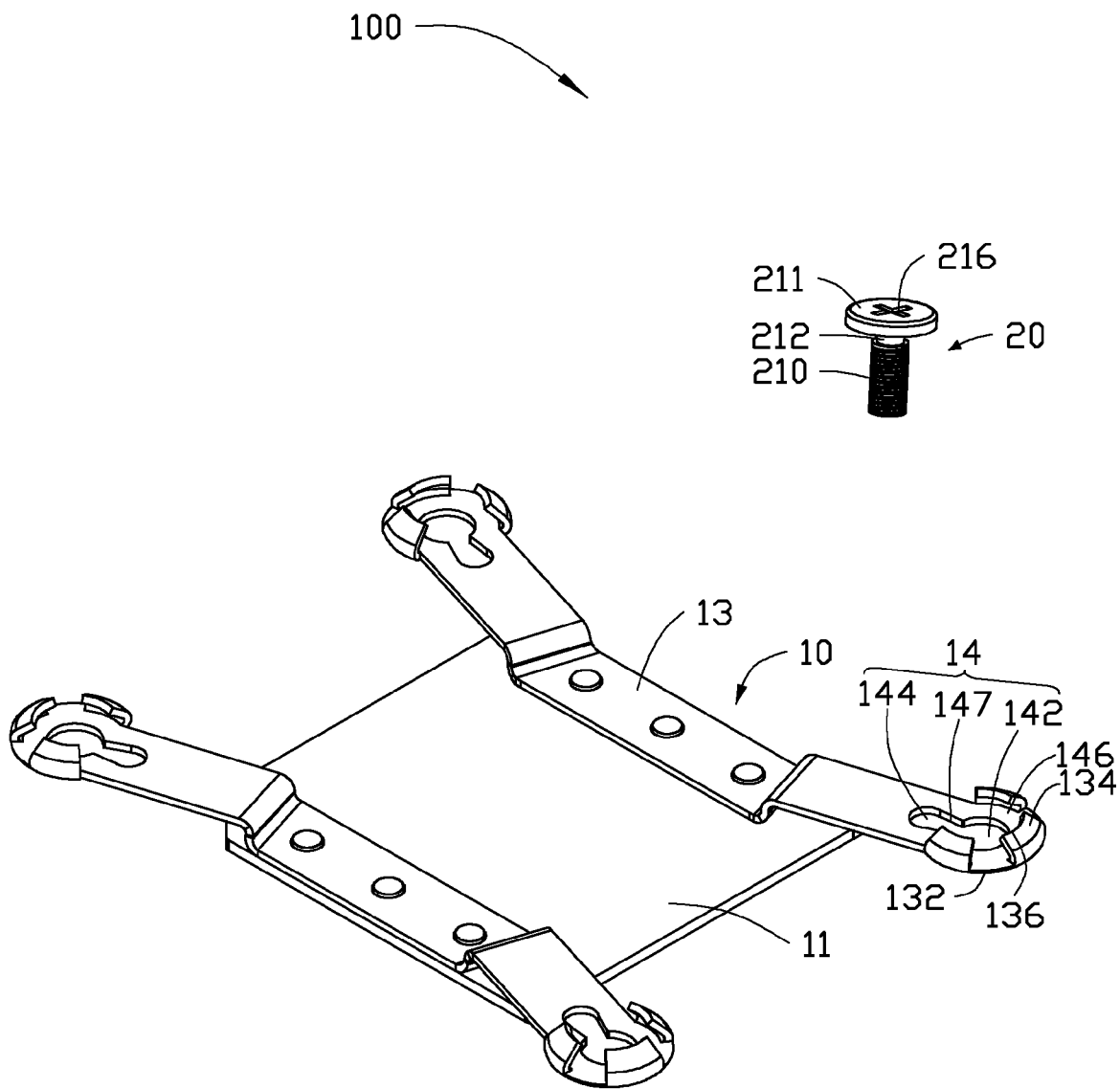
FIG. 1 is an isometric, exploded view of a heat dissipation device in accordance with a first embodiment of the disclosure.
Figure 2:
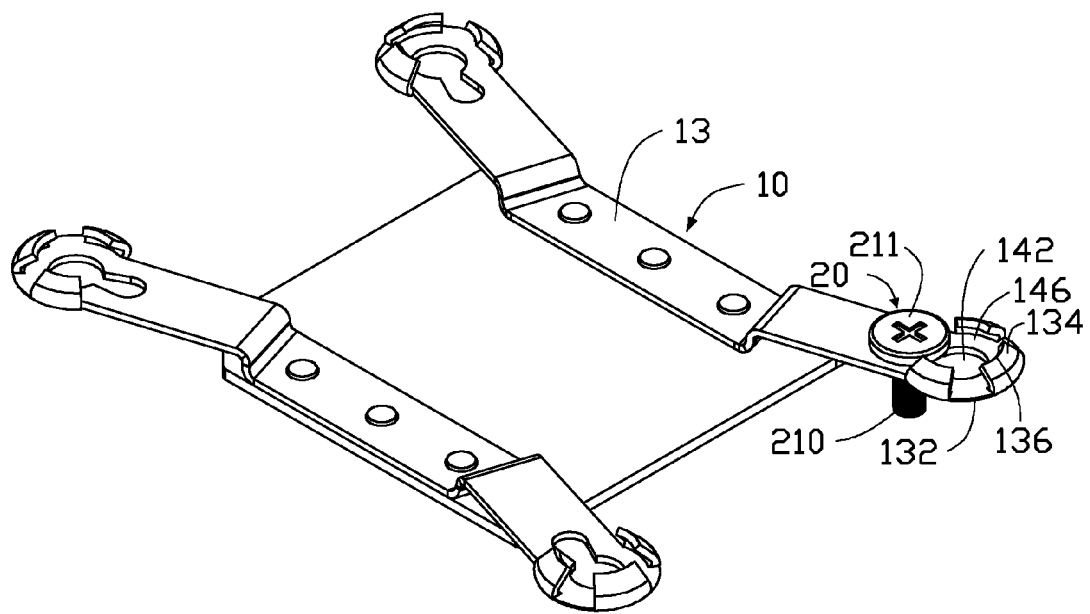
FIG. 2 is an assembled view of the heat dissipation device of FIG. 1, wherein a fastener of the heat dissipation device is in a released position.

Referring to FIGS. 1-2, a heat dissipation device 100 in accordance with a first embodiment of the disclosure is shown. The heat dissipation device 100 is for dissipating heat generated by an electronic device (not shown) mounted on a printed circuit board (not shown). The heat dissipation device 100 includes a base 10, and a fastener 20 for fastening the heat dissipation device 100 on the printed circuit board.

The base 10 includes a rectangular conductive plate 11 and two elongated arms 13 fixed at two opposite sides of the conductive plate 11. Each end of the arm 13 defines a receiving portion 14 through the arm 13. The receiving portion 14 includes an arc-shaped mounting hole 142, an arc-shaped inserting hole 144, and a guiding groove 147 communicating with the mounting hole 142 and the inserting hole 144. The arm 13 has an arc-shaped outer edge 132 at a periphery of the mounting hole 142. A plurality of spaced flanges 134 extend upwardly from the outer edge 132 of the arm 13 toward the mounting hole 142. The flanges 134 are integrally formed with the arm 13 as a single piece. The flanges 134 and the arm 13 cooperatively define a receiving space 146. The receiving space 146 is located above the mounting hole 142. Each flange 134 has an arc-shaped outer edge 136 away from the arm 13. The outer edges 136 of all flanges 134 are located in a same circle. An edge of the guiding groove 147 is tangential to an arc-shaped edge of the inserting hole 144. Widths of the guiding groove 147 decrease along a direction from the inserting hole 144 to the mounting hole 142. The width of the guiding groove 147 has the minimum value at a joint of the guiding groove 147 and the mounting hole 142. The inserting hole 144 has a diameter larger than the widths of the guiding groove 147 but smaller than a diameter of the mounting hole 142.

The fastener 20 includes a column-shaped neck portion 212, a circular head portion 211 extending from a top end of the neck portion 212, and a column-shaped engaging portion 210 extending from an opposite bottom end of the neck portion 212. The engaging portion 210 has a diameter smaller than that of the head portion 211 but larger than that of the neck portion 212.

The engaging portion 210 defines a plurality of threads on a periphery thereof. The diameter of the engaging portion 210 is equal to or smaller than that of the inserting hole 144 of the receiving portion 14, but larger than the widths of the guiding groove 147.

The diameter of the neck portion 212 is smaller than the widths of a portion of the guiding groove 147 near the inserting hole 144, only slightly larger than the minimum width of the guiding groove 147.

The head portion 211 defines an operating groove 216 in a top face thereof for facilitating operation of a tool such as a screwdriver to fasten the fastener 20 to the printed circuit board. A diameter of the circle where the outer edges 136 of the flanges 134 are located, the diameter of the mounting hole 142 and the diameter of the inserting hole 144 are smaller than that of the head portion 211.

Figure 3:
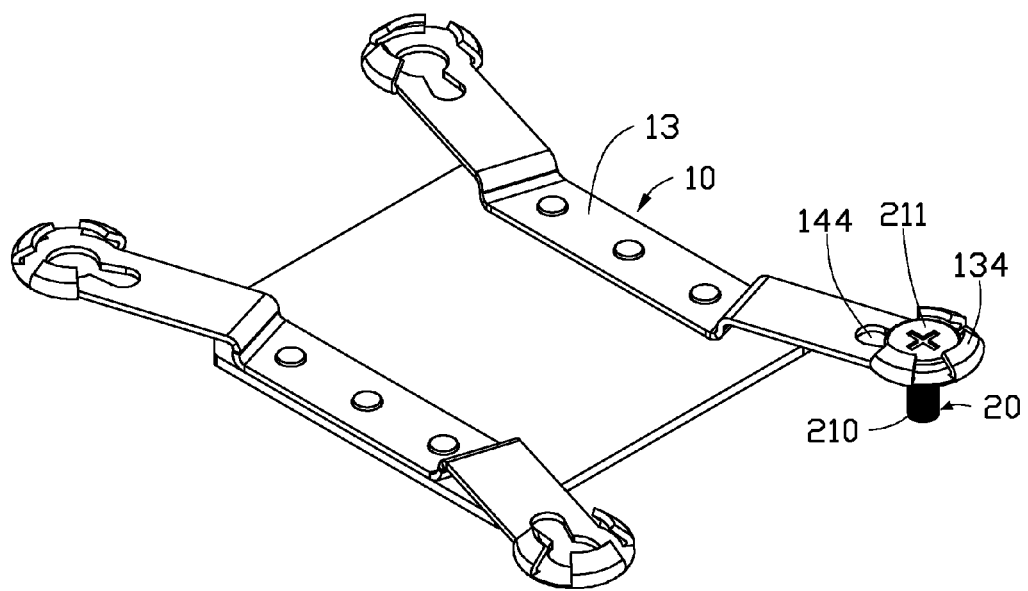
FIG. 3 is an assembled view of the heat dissipation device of FIG. 1, wherein a fastener of the heat dissipation device is in a locked position.

Also referring to FIG. 3, in assembly, the engaging portion 210 of the fastener 20 extends down through the inserting hole 144 from a top side of the base 10 to make the neck portion 212 enter the inserting hole 144, so that the head portion 211 and the engaging portion 210 are respectively located at top and bottom sides of the base 10. The fastener 20 is then moved horizontally from the inserting hole 144 towards the mounting hole 142. Since the diameter of the neck portion 212 is slightly larger than the minimum width at a joint of the guiding groove 147 and the mounting hole 142, the neck portion 212 is crushed into the mounting hole 142 from the joint of the guiding groove 147 and the mounting hole 142. The head portion 211 is received in the receiving space 146. A top face of the head portion 211 abuts the flanges 134, a bottom face of the head portion 211 abuts the top side of the base 10 at a periphery of the mounting hole 142. Thus, the fastener 20 is securely fastened on the base 10.

Figure 4:
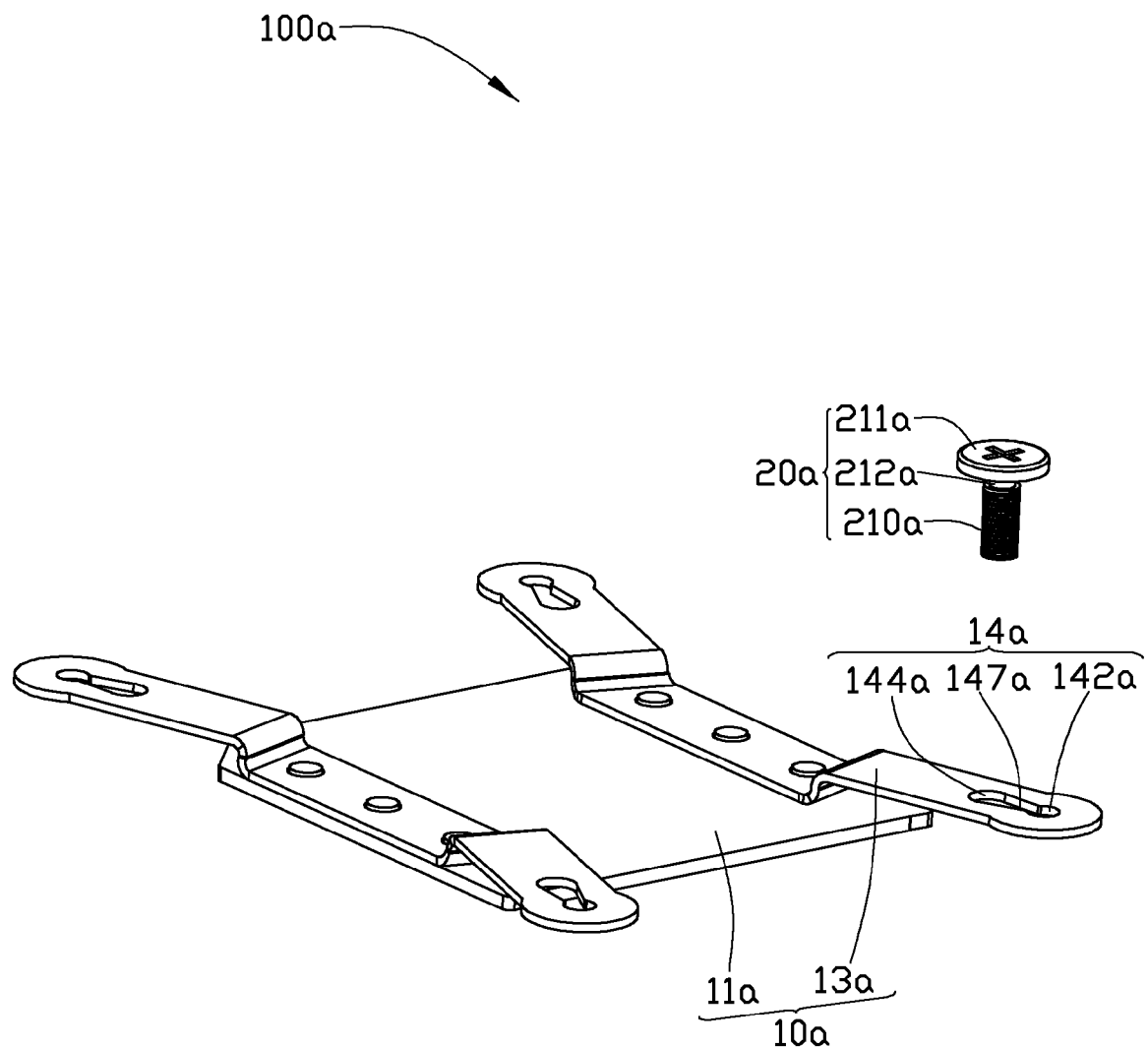
FIG. 4 is an isometric, exploded view of a heat dissipation device in accordance with a second embodiment of the disclosure.

Referring to FIG. 4, a heat dissipation device 100a in accordance with a second embodiment of the disclosure is shown. The heat dissipation device 100a includes a base 10a and a fastener 20a.

The base 10a includes a rectangular conductive plate 11a and two elongated arms 13a fixed at two opposite sides of the conductive plate 11a. Each end of the arm 13a defines a receiving portion 14a through the arm 13a. The receiving portion 14a includes an arc-shaped mounting hole 142a, an arc-shaped inserting hole 144a, and a guiding groove 147a communicating with the mounting hole 142a and the inserting hole 144a. An edge of the guiding groove 147a is tangential to an arc-shaped edge of the inserting hole 144a. Widths of the guiding groove 147a decrease along a direction from the inserting hole 144a to the mounting hole 142a. The width of the guiding groove 147a has the minimum value at a joint of the guiding groove 147a and the mounting hole 142a. The inserting hole 144a has a diameter larger than the widths of the guiding groove 147a.

The fastener 20a includes a column-shaped neck portion 212a, a circular head portion 211a extending from a top end of the neck portion 212a, and a column-shaped engaging portion 210a extending from an opposite bottom end of the neck portion 212a. The engaging portion 210a has a diameter smaller than that of the head portion 211a but larger than that of the neck portion 212a. The diameter of the neck portion 212a is slightly larger than the minimum width at a joint of the guiding groove 147a and the mounting hole 142a.

The differences between the first embodiment and the second embodiment are in that: there are no flanges extending from the arm 13a; the diameter of the engaging portion 210a is larger than that of the mounting hole 142a but smaller than that of the inserting hole 144a; when the neck portion 212a is crushed into the mounting hole 142a from the joint of the guiding groove 147a and the mounting hole 142a, the engaging portion 210a abuts a bottom side of the base 10a at a periphery of the mounting hole 142a, the head portion 211a abuts a top side of the base 10a at the periphery of the mounting hole 142a.

Figure 5:
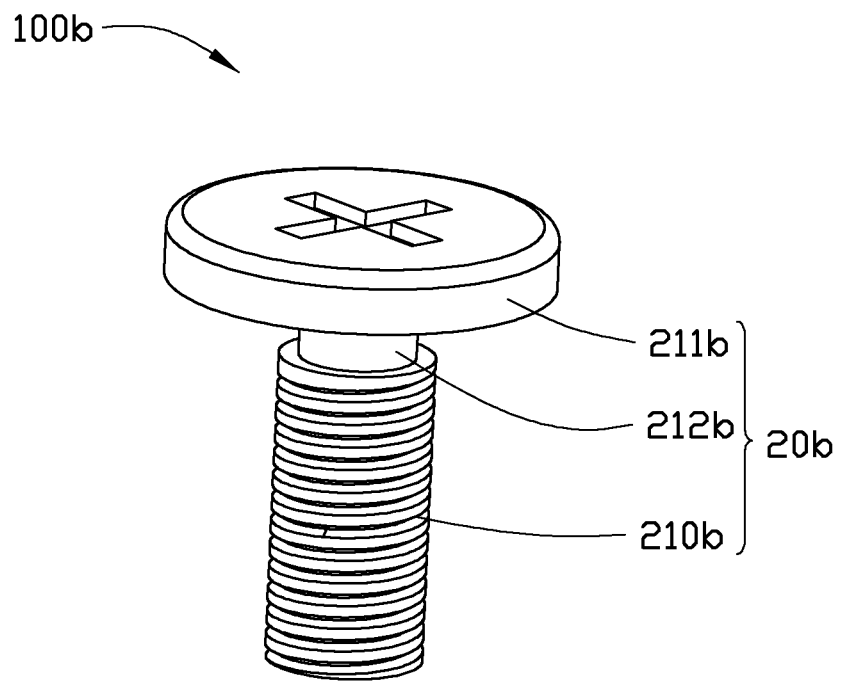
FIG. 5 is an isometric, exploded view of a heat dissipation device in accordance with a third embodiment of the disclosure.
Figure 5:
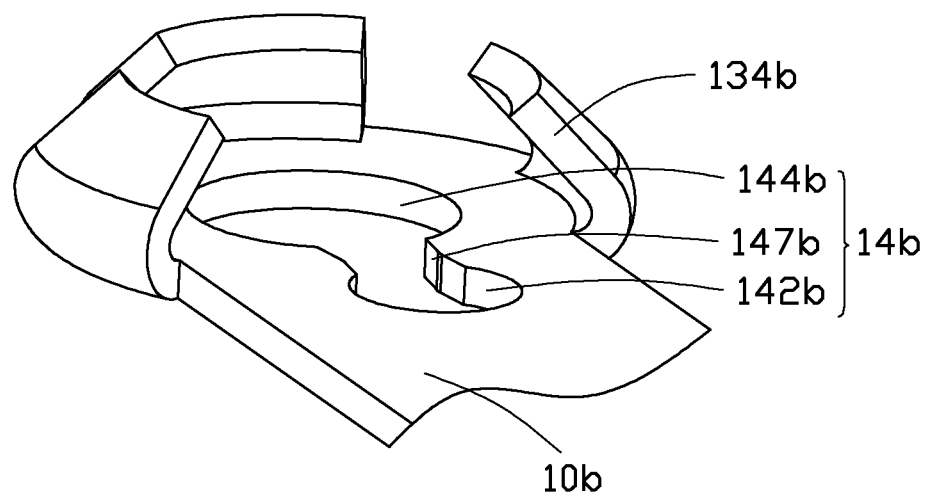

Referring to FIG. 5, a heat dissipation device 100b in accordance with a third embodiment of the disclosure is shown. The heat dissipation device 100b includes a base 10b and a fastener 20b.

The base 10b defines a receiving portion 14b through the base 10b. The receiving portion 14b includes an arc-shaped mounting hole 142b, an arc-shaped inserting hole 144b, and a guiding groove 147b communicating with the mounting hole 142b and the inserting hole 144b. A plurality of spaced flanges 134b extend upwardly from an outer edge of the base 10b toward the mounting hole 142b.

The fastener 20b includes a column-shaped neck portion 212b, a circular head portion 211b extending from a top end of the neck portion 212b, and a column-shaped engaging portion 210b extending from an opposite bottom end of the neck portion 212b.

The differences between the first embodiment and the third embodiment are in that: the guiding groove 147b has a same width along a direction from the inserting hole 144b to the mounting hole 142b, a diameter of the neck portion 212b is slightly larger than the width of the guiding groove 147b.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a base defining a receiving portion extending therethrough in a vertical direction, the receiving portion including an inserting hole and a mounting hole communicating with each other in a transverse direction perpendicular to said vertical direction, via a narrowed joint located between said inserting hole and said mounting hole and dimensioned with thereof a width smaller than diameters of both said inserting hole and said mounting hole; and
   a fastener including at least a head portion, an engaging portion with threads thereon which is diametrically smaller than the head portion, and therebetween a neck portion which is diametrically smaller than both said head portion and said engaging portion; wherein
   said width of said narrowed joint is dimensioned to be small enough to allow only said neck portion to snugly pass therethrough in the transverse direction while precluding said engaging portion and said head portion from passing therethrough when installing the fastener into the base from the inserting hole to the mounting hole;
   wherein said base forms a plurality flanges around the mounting hole except at a position adjacent to the joint for protection of the head portion when the fastener is moved from the inserting hole to the mounting hole.

2. The heat dissipation device of claim 1, wherein said fastener is dimensioned not to be allowed to back from the mounting hole, via said narrowed joint, to the inserting hole along said transverse direction when said head portion abuts against a top side of the base.

3. The heat dissipation device as claimed in claim 1, wherein said mounting hole is diametrically larger than the inserting hole.

* * * * *